(12) United States Patent
Jang et al.

(10) Patent No.: US 8,243,535 B2
(45) Date of Patent: Aug. 14, 2012

(54) SEMICONDUCTOR MEMORY DEVICE COMPRISING VARIABLE DELAY CIRCUIT

(75) Inventors: Dong-Su Jang, Anyang-si (KR); Yong-Ho Cho, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 212 days.

(21) Appl. No.: 12/731,465

(22) Filed: Mar. 25, 2010

(65) Prior Publication Data
US 2010/0246295 A1    Sep. 30, 2010

(30) Foreign Application Priority Data
Mar. 25, 2009   (KR) .................. 10-2009-0025601

(51) Int. Cl.
*G11C 7/00*   (2006.01)
(52) U.S. Cl. ......................... 365/194; 365/204
(58) Field of Classification Search .............. 365/194, 365/204, 205, 207
See application file for complete search history.

(56) References Cited

U.S. PATENT DOCUMENTS

| 2005/0068833 A1* | 3/2005 | Choi ........................... 365/222 |
| 2007/0008793 A1* | 1/2007 | Hirobe ........................ 365/194 |
| 2008/0159037 A1* | 7/2008 | Lee et al. .................... 365/208 |

FOREIGN PATENT DOCUMENTS

| JP | 2001282371 A | 10/2001 |
| KR | 1020060034994 A | 4/2006 |
| KR | 1020060049829 A | 5/2006 |

* cited by examiner

*Primary Examiner* — Vu Le
(74) *Attorney, Agent, or Firm* — Volentine & Whitt, PLLC (57) ABSTRACT

A semiconductor memory device comprises a memory cell configured to output data to a pair of bitlines, a variable delay circuit configured to receive a sense amplifier enable signal, adjust a delay of the sense amplifier enable signal by changing a slope of a delay based on a variable external power supply voltage, and output a delayed sense amplifier enable signal, and a bitline sense amplifier configured to amplify a voltage difference between the pair of bitlines in response to the delayed sense amplifier enable signal and output the amplified voltage difference to a pair of input/output lines.

14 Claims, 6 Drawing Sheets

SEMICONDUCTOR MEMORY DEVICE COMPRISING VARIABLE DELAY CIRCUIT

CROSS-REFERENCE TO RELATED APPLICATIONS

This application claims priority under 35 U.S.C. §119 to Korean Patent Application No. 10-2009-0025601 filed on Mar. 25, 2009, the disclosure of which is hereby incorporated by reference in its entirety.

BACKGROUND

Embodiments of the inventive concept relate generally to semiconductor memory devices. More particularly, embodiments of the inventive concept relate to semiconductor memory devices capable of adjusting a charge sharing time required to share charge between a cell capacitor and a bitline.

Various semiconductor devices, such as dynamic random access memories (DRAMs), store data in cell capacitors and read the data through bitlines connected to the cell capacitors. Because the cell capacitors in modern semiconductor devices tend to be relatively small and store relatively small amounts of charge, parasitic capacitances on the bitlines and other elements such as sense amplifiers can have a significant effect on the timing required to transfer the charges from the cell capacitors to other elements. In general, a cell capacitor must be connected to a bitline for a charge sharing time sufficient to account for the parasitic capacitances. For instance, to ensure an adequate sensing margin for a sense amplifier, a cell capacitor must be connected to a bitline long enough to transfer charges to the sense amplifier in the presence of parasitic capacitances. To ensure an adequate charge sharing time, semiconductor memory devices commonly include a delay circuit to control the timing of read operations.

Such delay circuits may be implemented, for instance, by a combination of gates or a resistor-capacitor (RC) delay circuit. RC delay circuits can be adjusted to provide different amounts of delay using adjustment elements such as fuses.

SUMMARY

Embodiments of the inventive concept provide a semiconductor memory device that adaptively adjusts the delay of a bitline charge sharing time by adjusting the variation of a variable output voltage according to the level of an external supply voltage.

According to one embodiment of the inventive concept, a semiconductor memory device comprise a memory cell configured to output data to a pair of bitlines, a variable delay circuit configured to receive a sense amplifier enable signal, adjust a delay of the sense amplifier enable signal by adjusting a slope of a delay voltage based on a variable external power supply voltage, and output a delayed sense amplifier enable signal, and a bitline sense amplifier configured to amplify a voltage difference between the pair of bitlines in response to the delayed sense amplifier enable signal and output the amplified voltage difference to a pair of input/output lines.

In certain embodiments, the variable delay circuit comprises an internal voltage generator configured to receive a reference voltage and the external power supply voltage and cause the delay voltage to reach to a predetermined level, a first delay voltage adjuster that is operable to adjust the slope of the delay voltage according to an increase in the external power supply voltage in response to a control signal, and a delay adjuster configured to receive the sense amplifier enable signal, adjust the delay of the sense amplifier enable signal according to a change in the delay voltage, and output the delayed sense amplifier enable signal.

In certain embodiments, the first delay voltage adjuster comprises a plurality of first resistors connected in parallel, each of the first resistors having a first end and a second end, the respective first ends configured to receive the external power supply voltage, and a plurality of first switches each having a first end connected to an output node receiving the delay voltage, and a second end configured to be connected with a corresponding one of the second ends of the first resistors in response to the control signal.

In certain embodiments, the first delay voltage adjuster keeps the delay voltage at a predetermined voltage level in a first section in which the semiconductor memory device operates at a normal speed, and increases the delay voltage with a first slope in proportion to the increase in the external power supply voltage in a second section in which the external power supply voltage is increased for high-speed operation.

In certain embodiments, the first delay voltage adjuster increases the first slope in proportion to a number of first switches turned on in response to the control signal in the second section.

In certain embodiments, the delay adjuster maintains a uniform bitline charge sharing time as the delay voltage is maintained at the predetermined level in the first section, and reduces the bitline charge sharing time with a second slope in inverse proportion to the increase in the external power supply voltage as the voltage of the output node increases with the first slope in the second section.

In certain embodiments, the variable delay circuit further comprises a second delay voltage adjuster configured to receive an output voltage of the memory cell and increase the output voltage with a third slope more gradual than the first slope in proportion to the increase in the external power supply voltage in response to the control signal in the first section.

In certain embodiments, the second delay voltage adjuster comprises a plurality of second resistors connected in parallel, each of the second resistors comprising a first end and a second end, the respective second ends receiving the output voltage, and a plurality of second switches each having one end connected to a corresponding one of the second resistors, and another end connected with a second end of a corresponding one of the second resistors in response to the control signal.

In certain embodiments, the second delay voltage adjuster increases the third slope in proportion to a number of second switches turned on in response to the control signal in the first section.

In certain embodiments, the delay adjuster reduces a bitline charge sharing time with a fourth slope in inverse proportion to the increase in the external power supply voltage as the output voltage increases with the third slope in the first section, and reduces the bitline charge sharing time with a sixth slope steeper than the fourth slope in inverse proportion to the increase in the external power supply voltage as the output voltage increases with a fifth slope steeper than the third slope in the second section.

BRIEF DESCRIPTION OF THE DRAWINGS

Embodiments of the inventive concept will be more clearly understood from the following detailed description taken in conjunction with the accompanying drawings. In the drawings, like reference numerals denote like features and various aspects of the drawings may be exaggerated for clarity of illustration.

DETAILED DESCRIPTION OF THE EMBODIMENTS

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Figure 1:
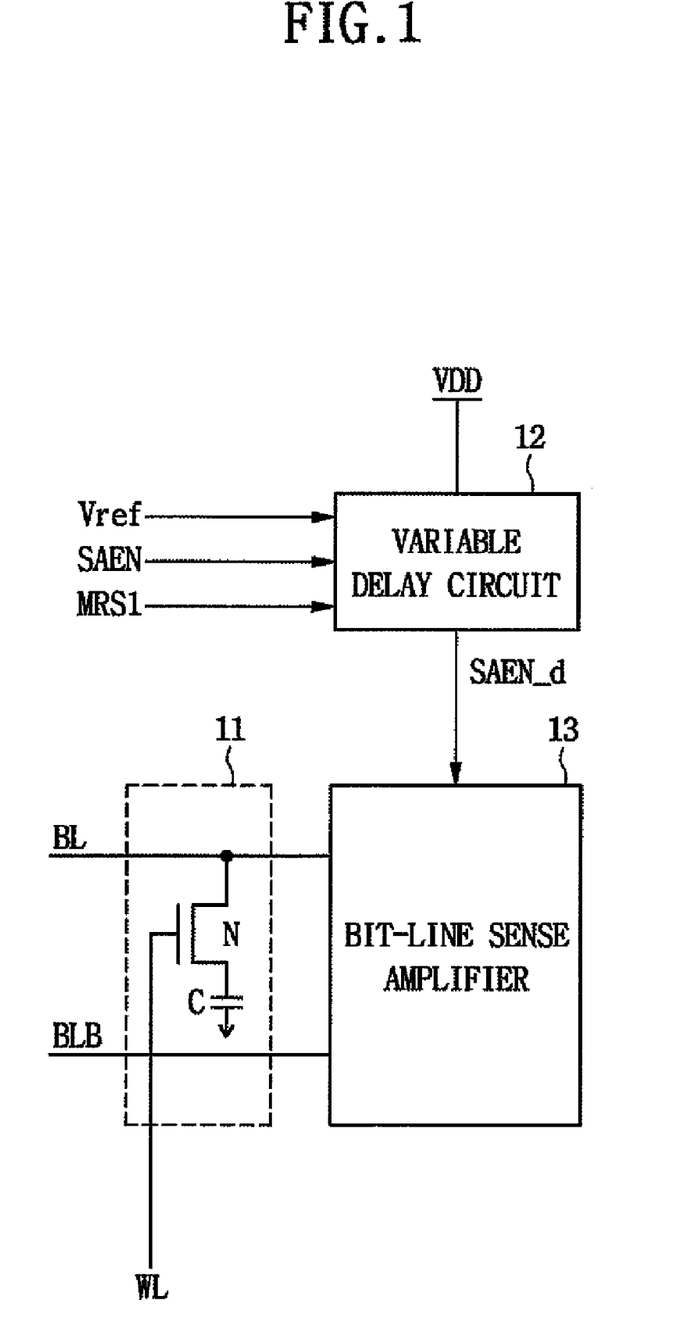
FIG. 1 is a block diagram of a semiconductor memory device according to selected embodiments of the inventive concept.

FIG. 1 is a block diagram of a semiconductor memory device in accordance with selected embodiments of the inventive concept. The semiconductor memory device comprises a memory cell 11, a variable delay circuit 12, and a bitline sense amplifier 13.

Memory cell 11 comprises an n-type metal oxide semiconductor (NMOS) transistor "N" and a capacitor "C". One end of NMOS transistor "N" is connected with capacitor "C", another end is connected with a bitline BL, and a gate of NMOS transistor "N" is connected with a wordline WL.

Wordline WL is activated in response to a received row address. Memory cell 11 outputs data stored in capacitor "C" to a pair of bitlines BL and BLB.

Variable delay circuit 12 receives a sense amplifier enable signal SAEN, adjusts a delay according to a variable external power supply voltage VDD in response to a control signal MRS1, and outputs a delayed sense amplifier enable signal SAEN_d. Bitline sense amplifier 13 amplifies data carried on bitlines BL and BLB in response to delayed sense amplifier enable signal SAEN_d.

Figure 2:
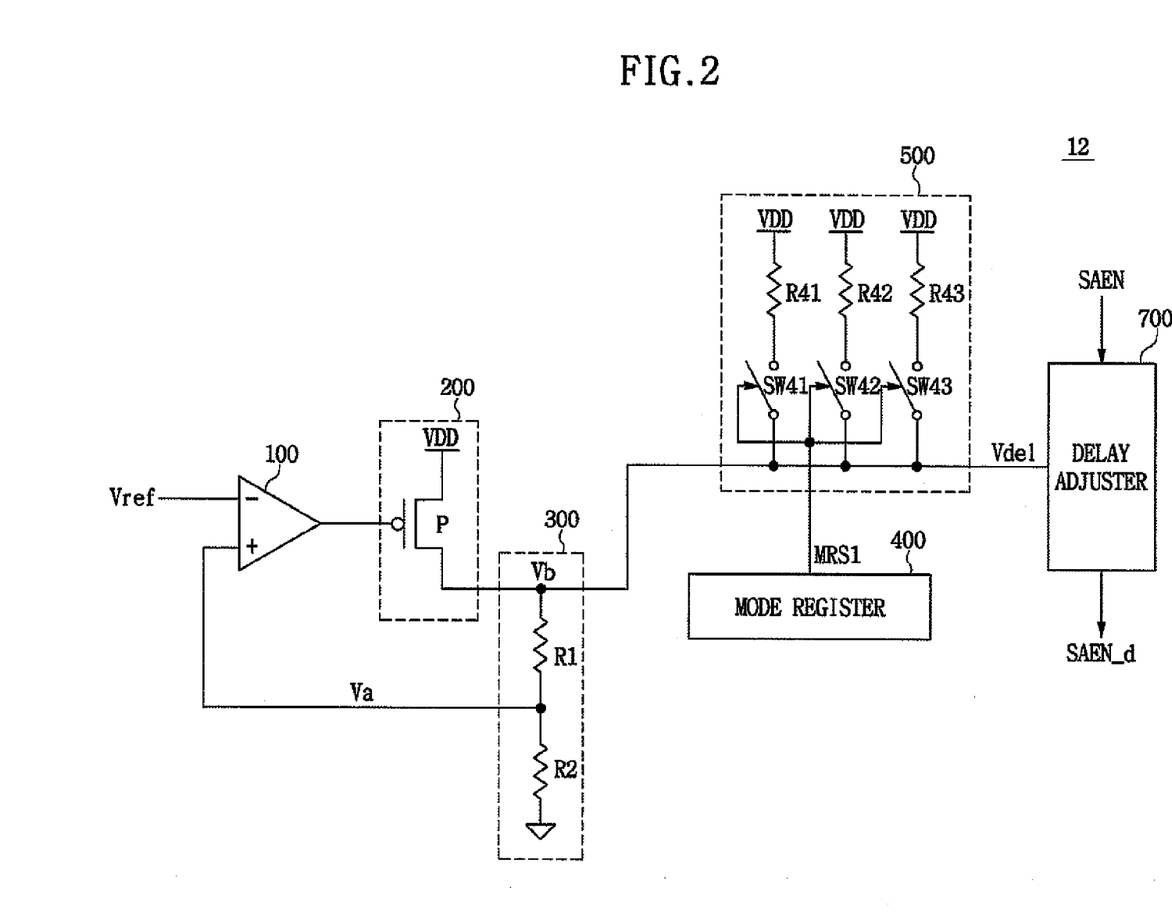
FIG. 2 is a block diagram illustrating one embodiment of a variable delay circuit in the semiconductor memory device shown in FIG. 1.

FIG. 2 is a block diagram illustrating one embodiment of variable delay circuit 12 in the semiconductor memory device shown in FIG. 1. Referring to FIG. 2, variable delay circuit 12 comprises a comparison voltage generator 100, a voltage driver 200, a voltage divider 300, a mode register 400, a delay voltage adjuster 500, and a delay adjuster 700.

Voltage driver 200 comprises a p-type metal oxide semiconductor (PMOS) transistor "P", and voltage divider 300 comprises a plurality of resistors R1 and R2 connected in series. Delay voltage adjuster 500 comprises a plurality of resistors R41, R42, and R43 connected in parallel and a plurality of switches SW41, SW42, and SW43 connected in parallel.

Comparison voltage generator 100 receives a reference voltage Vref and a division voltage Va, and outputs a comparison voltage differentially amplified according to a difference between the two received voltages. Voltage driver 200 receives external power supply voltage VDD through a source terminal, and outputs an output voltage Vb in response to the comparison voltage applied to a gate terminal. Voltage divider 300 receives output voltage Vb of voltage driver 200, divides output voltage Vb based on the resistances of resistors R1 and R2, and outputs division voltage Va. Mode register 400 outputs control signal MRS1 to control a slope of the magnitude of output voltage Vb. Delay voltage adjuster 500 adjusts the variation of a delay voltage Vdel in response to control signal MRS1, and outputs changed delay voltage Vdel. The variation of delay voltage Vdel is controlled by changing the resistance between external power supply voltage VDD and an output node of delay voltage adjuster 500 in response to control signal MRS1. Delay adjuster 700 adjusts a delay of sense amplifier enable signal SAEN according to the change in delay voltage Vdel, and outputs delayed sense amplifier enable signal SAEN_d.

Figure 3:
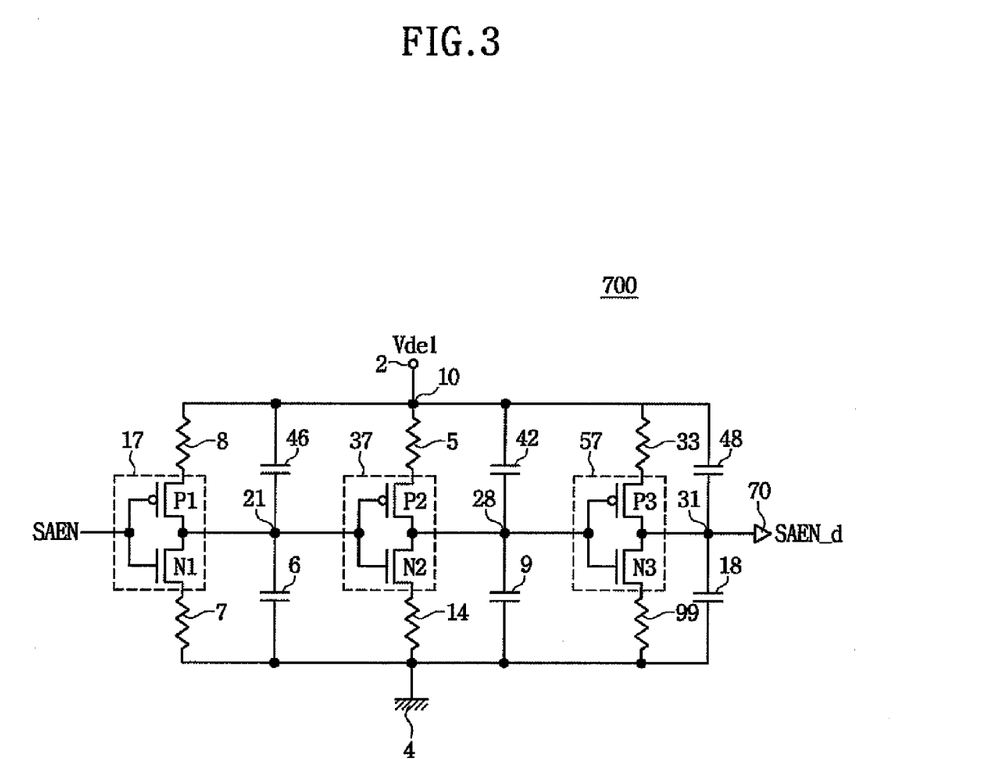
FIG. 3 is a circuit diagram of a delay adjuster illustrated in FIG. 2.

FIG. 3 is a circuit diagram illustrating an embodiment of delay adjuster 700 of FIG. 2. Delay adjuster 700 comprises a plurality of inverters 17, 37, and 57, a plurality of first resistors 8, 5, and 33, a plurality of second resistors 7, 14, and 99, and a plurality of capacitors 6, 9, 18, 42, 46, and 48.

First and second resistors 8, 5, 33, 7, 14, and 99 are connected in series with the channel resistances of PMOS transistors P1, P2, and P3, and NMOS transistors N1, N2, and N3, as illustrated in FIG. 3. These resistors control the voltages on nodes 21, 28 and 31 in response to sense amplifier enable signal SAEN and the respective outputs of inverters 17, 37, and 57. Additionally, capacitors 6, 9, 18, 42, 46, and 48 increase the respective loads of inverters 17, 37, and 57.

The operation of these elements can be understood by the following description of inverter 17. When sense amplifier enable signal SAEN is at a low level, inverter 17 has a resistor-capacitor (RC) time constant determined by the channel resistance of PMOS transistor P1, resistor 8, and capacitor 46, and raises a gate node 21 of inverter 37 to delay voltage Vdel. On the other hand, when sense amplifier enable signal SAEN is at a high level, inverter 17 has an RC time constant determined by the channel resistance of NMOS transistor N1, resistor 7, and capacitor 6, and reduces gate node 21 of inverter 37 to a ground voltage 4, thereby delaying sense amplifier enable signal SAEN.

When delay voltage Vdel supplied to inverters 17, 37, and 57 increases, gate-source voltages Vgs of PMOS transistors P1, P2, and P3 and NMOS transistors N1, N2, and N3 within inverters 17, 37, and 57 increase, causing the transistors' respective channel resistances to decrease. Consequently, the transistors' drain current value Idsat increases, and an RC time constant of a channel resistance, a resistor, and a capacitor decreases. As a result, the delay of sense amplifier enable signal SAEN passing through inverters 17, 37, and 57 is reduced. On the other hand, when delay voltage Vdel decreases, the transistors' respective channel resistances increase, and RC time constant increases. Consequently, the delay of sense amplifier enable signal SAEN passing through inverters 17, 37, and 57 increases.

The amount of charge stored in or discharged from each capacitor in FIG. 3 varies in proportion to changes in delay voltage Vdel, and drain current values Idsat of PMOS transistors P1, P2, and P3 and NMOS transistors N1, N2, and N3 vary in proportion to the square of the gate-source voltages Vgs according to change in the delay voltage Vdel. These relationships are expressed by the following equations (1) and (2):

$$\text{Drain current Idsat} = 1/2 k_n' W/L (Vgs-Vt)^2 \qquad (1)$$

$$\text{Electric charge } Q \text{ stored in a capacitor} = CVdel \qquad (2)$$

In equation (1), Vgs denotes the gate-source voltage of a transistor, Vt denotes the threshold voltage of the transistor, W denotes the channel width of the transistor, L denotes the channel length of the transistor, and $k_n'$ is a transconductance parameter equal to a product of electron mobility and oxide capacitance of the transistor. In equation (2), "Q" denotes charge, "C" denotes capacitance, and Vdel denotes delay voltage.

The delay of sense amplifier enable signal SAEN passing through inverters 17, 37, and 57 decreases with an increase in delay voltage Vdel, and the delay of sense amplifier enable signal SAEN passing through inverters 17, 37, and 57 increases with a decrease in delay voltage Vdel. Accordingly, delay voltage Vdel is inversely proportional to the delay of sense amplifier enable signal SAEN.

For convenience of illustration, delay adjuster 700 is shown with three inverter stages in FIG. 3. However, additional stages comprising further inverters, resistors, and capacitors could be added to generate a required delay.

A charge sharing time between a bitline and a cell capacitance varies according to the magnitude of external power supply voltage VDD. For instance, in a section where delay voltage Vdel is at or above the level of reference voltage Vref and external power supply voltage VDD is relatively high, the charge sharing time decreases. On the other hand, in a section where delay voltage Vdel is below the level of reference voltage Vref and external power supply voltage VDD is relatively low, the charge sharing time increases.

FIGS. 4A and 4B are graphs illustrating the operation of the variable delay circuit illustrated in FIG. 3. FIG. 4A shows changes in delay voltage Vdel in response to increases in external power supply voltage VDD, and FIG. 4B shows changes in a bitline charge sharing time Td in response to increases in external power supply voltage VDD.

A straight line 1a in FIG. 4A represents a change in delay voltage Vdel when switches SW41, SW42, and SW43 of delay voltage adjuster 500 shown in FIG. 2 are turned on in response to control signal MRS1 of mode register 400 to connect resistors R41, R42 and R43 in parallel. A straight line 2a in FIG. 4A represents a change in delay voltage Vdel when only one of switches SW41, SW42, or SW43 is turned on in response to control signal MRS1 of mode register 400 to connect only one of resistors R41, R42, or R43.

A straight line 1b in FIG. 4B represents a change in bitline charge sharing time Td when all switches SW41, SW42, and SW43 of delay voltage adjuster 500 shown in FIG. 2 are turned on in response to control signal MRS1 of mode register 400 to connect resistors R41, R42, and R43 in parallel. A straight line 2b in FIG. 4B represents a change in bitline sharing time Td when only one of switches SW41, SW42, and SW43 is turned on in response to control signal MRS1 of mode register 400 to connect only one of resistors R41, R42, or R43.

In a first section of FIG. 4A, when external power supply voltage VDD increases from 0 V to a first voltage V1, delay voltage Vdel increases in proportion to external power supply voltage VDD. In a second section of FIG. 4A, when external power supply voltage VDD increases from first voltage V1 to a second voltage V2, delay voltage Vdel is kept at a uniform level. In a third section of FIG. 4A, when external power supply voltage VDD increases above second voltage V2, delay voltage Vdel increases with a uniform slope in proportion to external power supply voltage VDD. Here, the variation of straight line 2a with respect to a change in external power supply voltage VDD is smaller than that of straight line 1a with respect to a change in external power supply voltage VDD.

In a first section of FIG. 4B, when external power supply voltage VDD increases from 0 V to first voltage V1 and bitline charge sharing time Td decreases in inverse proportion to an increase of external power supply voltage VDD. In a second section of FIG. 4B, when external power supply voltage VDD increases from first voltage V1 to second voltage V2, bitline charge sharing time Td is kept uniform regardless of external power supply voltage VDD. In a third section of FIG. 4B, when external power supply voltage VDD increases above second voltage V2, bitline charge sharing time Td decreases with a uniform slope in inverse proportion to the increase of external power supply voltage VDD. Here, the variation of straight line 2b with respect to a change in external power supply voltage VDD is smaller than that of straight line 1b.

The operation of the variable delay circuit of FIG. 2 will be further described below with reference to FIGS. 1 through 4.

In general, dynamic random access memory (DRAM) devices store data in memory cells each comprising a cell capacitor. The data is stored in the form of electrical charge on the cell capacitor.

To read data stored in the DRAM, the electrical charge stored in the cell capacitor is transferred to a bitline and amplified by a bitline sense amplifier.

Because the bitline has capacitance and resistance components, a charge sharing time is required to transfer charges from the cell capacitor to the bitline sense amplifier. Typically, an RC delay is used to ensure such a charge sharing time. But when a charge sharing time is based on a fixed RC delay, the fixed delay may limit the operating speed of a semiconductor memory device using a high voltage. In other words, in semiconductor memory device using a high voltage, faster performance may be achieved by adjusting the RC delay to reduce the charge sharing time.

To achieve this faster performance, a technique may be used to maintain a fixed delay until external power supply voltage VDD rises to a predetermined level. Then, once external power supply voltage VDD reaches or exceeds the predetermined level, the charge sharing time may be reduced.

Meanwhile, comparison voltage generator 100 receives reference voltage Vref and division voltage Va and outputs a comparison voltage differentially amplified according to a difference between the two voltages. Voltage driver 200 receives external power supply voltage VDD and outputs output voltage Vb in response to the comparison voltage.

When division voltage Va falls below reference voltage Vref, PMOS transistor P within voltage driver 200 is turned on, and the level of delay voltage Vdel rises.

Voltage divider 300 receives output voltage Vb, divides output voltage Vb using resistors R1 and R2, and outputs division voltage Va according to the following equation (3):

$$Va = Vb \times R2/(R1+R2) \qquad (3)$$

This operation is repeated by receiving division voltage Va fed back from comparison voltage generator 100 until division voltage Va has the same voltage level as reference voltage Vref.

In the second section of FIG. 4A, a voltage follower formed by voltage driver 200 and voltage divider 300 has a higher output level than a voltage division logic formed by delay voltage adjuster 500 and voltage divider 300. The voltage division logic acts to reduce output voltage Vb, and the voltage follower acts to maintain division voltage Va at the level of reference voltage Vref.

When the level of output voltage Vb decreases under the influence of the voltage division logic, the level of division voltage Va decreases, and the level of comparison voltage output from comparison voltage generator 100 decreases. Consequently, PMOS transistor P within voltage driver 200 is turned on and the resistance of PMOS transistor P becomes much lower than each of the resistances of resistors R1 and R2 of voltage divider 300.

In addition, PMOS transistor P turns on and reduces the resistance of PMOS transistor P. As a result, resistors R41, R42, and R43 of delay voltage adjuster 500 are connected in parallel with PMOS transistor P. Thus, current flows to the voltage follower having PMOS transistor P and the level of output voltage Vb rises such that division voltage Va satisfies the following equation (4):

$$Va = Vref = Vb \times R2/(R1+R2) \qquad (4)$$

At the same time, delay voltage Vdel has a uniform value as shown in the following equation (5):

$$Vdel = Vb = Vref \times (1+R1/R2) \qquad (5)$$

Delay voltage adjuster 500 adjusts the slope of delay voltage Vdel according to the level of external power supply voltage VDD. Delay voltage adjuster 500 accomplishes this by changing the resistance between a node to which external power supply voltage VDD is applied and the output node in response to control signal MRS1. Assuming that the total resistance of resistors R41, R42, and R43 is R4, the following equation (6) expresses the delay voltage Vdel proportional to external power supply voltage VDD according to the voltage divider rule:

$$Vdel = Vb = VDD \times (R1+R2)/(R1+R2+R4) \qquad (6)$$

In other words, in the third section of FIG. 4, external power supply voltage VDD increases more than in the second section, and the output level of the voltage follower consisting of voltage driver 200 and voltage divider 300 falls below that of the voltage division logic consisting of delay voltage adjuster 500 and voltage divider 300.

Consequently, when output voltage Vb rises, division voltage Va rises in proportion to output voltage Vb, and the comparison voltage output from comparison voltage generator 100 rises. As a result, PMOS transistor P, which is comprised within voltage driver 200, is turned off and increases resistance.

Further, resistors R41, R42, and R43 of delay voltage adjuster 500 are connected in parallel with PMOS transistor P, which is turned off and has increased resistance. Consequently, current flows to the voltage division logic having resistors R41, R42, and R43 with a relatively small resistance, and delay voltage Vdel changes in accordance with equation (6).

Figure 4:
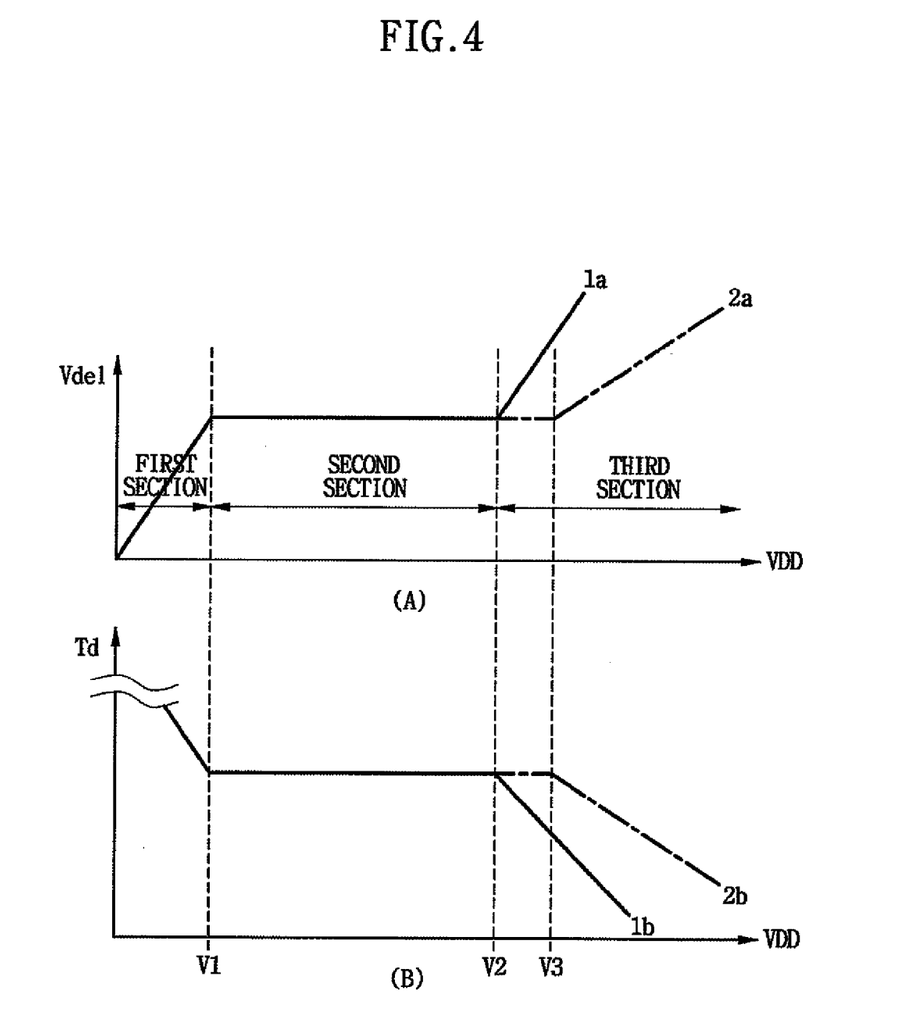
FIGS. 4A and 4B are graphs illustrating the operation of the variable delay circuit illustrated in FIG. 2.

In the second section of FIG. 4A, when the semiconductor memory device operates at a normal operating speed, output voltage Vb satisfies equation (5). However, in the third section of FIG. 4, when external power supply voltage VDD is artificially increased for high-speed operation of the semiconductor memory device, output voltage Vb calculated by equation (6) becomes higher than the output voltage calculated by equation (5), and thus output voltage Vb satisfies equation (6).

As a result, in the first section of FIG. 4A, when division voltage Va is lower than reference voltage Vref, delay voltage Vdel becomes equal to output voltage Vb as external power supply voltage VDD increases, and delay voltage Vdel increases in proportion to external power supply voltage VDD as shown in FIG. 4A.

In the second section of FIG. 4A, when division voltage Va increases to the same level as reference voltage Vref, delay voltage Vdel becomes equal to output voltage Vb as shown in equation (5). Thus, the level of delay voltage Vdel is kept at the constant (Vref×(1+R1/R2)) of equation (5) regardless of an increase in external power supply voltage VDD, beginning with external power supply voltage VDD of first voltage V1 or above. In other words, first voltage V1 becomes Vref×(1+R1/R2).

In the third section of FIG. 4A, when division voltage Va further increases to have a higher level than reference voltage Vref, PMOS transistor P of voltage driver 200 is turned off. Consequently, beginning with external power supply voltage VDD of second voltage V2 or above, delay voltage Vdel becomes equal to output voltage Vb as shown in equation (6), and delay voltage Vdel increases with the uniform slope ((R1+R2)/(R1+R2+R4)) in proportion to an increase in external power supply voltage VDD. In other words, second voltage V2 becomes Vref×(R1+R2+R4)/R2.

In the third section of FIG. 4A, resistance R4 of equation (6) is larger when one of switches SW41, SW42, or SW43 is turned on in response to control signal MRS1 to connect only one of resistors R41, R42, or R43. The case that all switches SW41, SW42, and SW43 are turned on in response to control signal MRS1 of mode register 400 to connect resistors R41, R42, and R43 in parallel (1a) creates a smaller resistance R4. Thus, in FIG. 4A, the slope of straight line 2a is gentler than that of straight line 1a.

At this point, in FIG. 4A, second voltage V2 increases as resistance R4 increases. Thus, external power supply voltage VDD also increases to a third voltage V3 at a point in time when the slope of the straight line 2a varies.

For this reason, in the first section of FIG. 4B, when external power supply voltage VDD increases from 0 V to first voltage V1, the bitline charge sharing time decreases in inverse proportion to an increase of external power supply voltage VDD. Also, in the second section of FIG. 4B, when external power supply voltage VDD increases from first voltage V1 to second voltage V2, delay voltage Vdel is kept at a uniform level (Vref×(1+R1/R2)) in FIG. 4A. Consequently, the bitline charge sharing time is kept uniform regardless of the increase in external power supply voltage VDD. In the third section of FIG. 4B, when external power supply voltage VDD increases above second voltage V2, delay voltage Vdel increases with the uniform slope ((R1+R2)/(R1+R2+R4)) in proportion to an increase of external power supply voltage VDD in FIG. 4A. As a result, the bitline charge sharing time decreases with a uniform slope in inverse proportion to the increase in external power supply voltage VDD.

In the third section of FIG. 4B, only one of switches SW41, SW42, or SW43 is turned on in response to control signal MRS1 to connect only one of resistors R41, R42, or R43 (2b). Consequently, the bitline charge sharing time decreases more slowly than a case that all switches SW41, SW42, and SW43 are turned on in response to control signal MRS1 to connect resistors R41, R42, and R43 in parallel (1b). As a result, in FIG. 4B, the slope of straight line 2b is more gradual than that of straight line 1b. Here, second voltage V2 increases with an increase in resistance R4, and thus external power supply voltage VDD at a point in time when the slope of straight line 2b varies also increases to third voltage V3.

As described above, delay voltage adjuster 500 comprises resistors R41, R42, and R43 connected in parallel and switches SW41, SW42, and SW43 connected in parallel. Delay voltage adjuster 500 adjusts the slope of delay voltage Vdel according to external power supply voltage VDD by controlling switches SW41, SW42, and SW43 to be turned on and off in response to control signal MRS1 of mode register 400. Alternatively, delay voltage adjuster 500 may comprise resistors R41, R42, and R43 connected in parallel and a plurality of transmission gates connected in parallel, and adjust the slope of delay voltage Vdel by controlling the transmission gates to open or close in response to control signal MRS1.

Variable delay circuit 12 in the semiconductor memory device, according to the embodiment of FIG. 2, maintains a uniform level of delay voltage Vdel until external power supply voltage VDD increases to a predetermined operating voltage. Variable delay circuit 12 further controls the variable slope of delay voltage Vdel when external power supply voltage VDD is at or above the predetermined operating voltage, which adjusts the bitline charge sharing time. Thus, it is possible to improve the operating speed of the semiconductor memory device by artificially increasing the operating voltage for high-speed operation.

Figure 5:
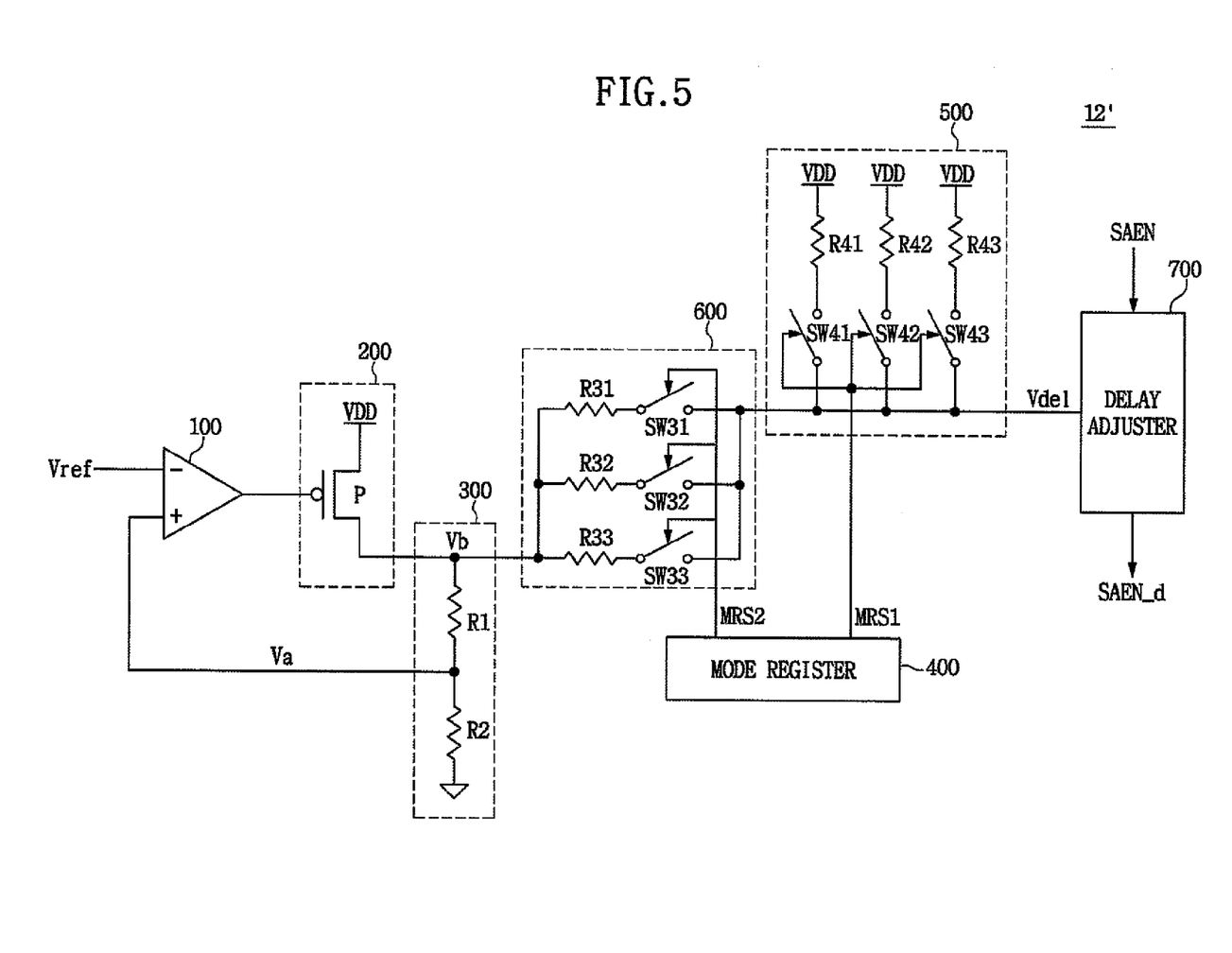
FIG. 5 is a block diagram illustrating another embodiment of the variable delay circuit in the semiconductor memory device show in FIG. 1.

FIG. 5 is a block diagram of a variable delay circuit 12' in the semiconductor memory device of FIG. 1 according to another embodiment.

Referring to FIG. 5, variable delay circuit 12' comprises comparison voltage generator 100, voltage driver 200, voltage divider 300, mode register 400, first delay voltage adjuster 500, second delay voltage adjuster 600, and delay adjuster 700.

Voltage driver 200 comprises a PMOS transistor P, and voltage divider 300 comprises a plurality of resistors R1 and R2 connected in series. First delay voltage adjuster 500 comprises a plurality of resistors R41, R42, and R43 connected in parallel and a plurality of switches SW41, SW42, and SW43 connected in parallel. Second delay voltage adjuster 600 comprises a plurality of resistors R31, R32, and R33 connected in parallel and a plurality of switches SW31, SW32, and SW33 connected in parallel.

In variable delay circuit 12', comparison voltage generator 100, voltage driver 200, voltage divider 300, and delay adjuster 700 in the same way as in the embodiment shown in FIG. 2. Accordingly, a further description of these components will be omitted to avoid redundancy.

Mode register 400 outputs first and second control signals MRS1 and MRS2 to control the slope of a delay voltage Vdel.

First delay voltage adjuster 500 receives external power supply voltage VDD and adjusts the slope of delay voltage Vdel according to external power supply voltage VDD in response to first control signal MRS1.

Second delay voltage adjuster 600 changes a resistance between a node to which an output voltage Vb is applied and a common output node of first and second delay voltage adjusters 500 and 600 in response to second control signal MRS2, thereby adjusting the slope of delay voltage Vdel according to output voltage Vb, which has a lower level than external power supply voltage VDD.

FIGS. 6A and 6B are graphs illustrating the operation of the variable delay circuit of FIG. 5. FIG. 6A shows a change in delay voltage Vdel according to an increase in external power supply voltage VDD, and FIG. 6B shows a change in bitline charge sharing time Td according to an increase in external power supply voltage VDD.

A straight line 1c in FIG. 6A represents a change in delay voltage Vdel when all switches SW41, SW42, and SW43 of first delay voltage adjuster 500 are turned on in response to first control signal MRS1 of mode register 400 to connect resistors R41, R42, and R43 in parallel. A straight line 2c represents a change in delay voltage Vdel when only one of switches SW41, SW42, or SW43 is turned on in response to first control signal MRS1 to connect only one of resistors R41, R42, or R43.

A straight line 3c represents a change in delay voltage Vdel when all switches SW31, SW32, and SW33 of second delay voltage adjuster 600 are turned on in response to second control signal MRS2 of mode register 400 to connect resistors R31, R32, and R33 in parallel. A straight line 4c represents a change in delay voltage Vdel when only one of switches SW31, SW32, or SW33 is turned on in response to second control signal MRS2 of mode register 400 to connect only one of resistors R31, R32, or R33.

A straight line 1d in FIG. 6B represents a change in bitline charge sharing time Td when all switches SW41, SW42, and SW43 of first delay voltage adjuster 500 are turned on in response to first control signal MRS1 to connect all resistors R41, R42, and R43 in parallel. A straight line 2d represents a change in bitline sharing time Td when only one of switches SW41, SW42, or SW43 is turned on in response to control signal MRS1 to connect to only one of resistors R41, R42, and R43.

A straight line 3d represents a change in bitline charge sharing time Td when all switches SW31, SW32, and SW33 of second delay voltage adjuster 600 are turned on in response to second control signal MRS2 to connect resistors R31, R32, and R33 in parallel. A straight line 4d represents a change in bitline charge sharing time Td when only one of switches SW31, SW32, or SW33 is turned on in response to second control signal MRS2 to connect only one of resistors R31, R32, and R33.

In a first section of FIG. 6A in which external power supply voltage VDD increases from 0 V to first voltage V1, delay voltage Vdel increases in proportion to external power supply voltage VDD. In a second section of FIG. 6A in which external power supply voltage VDD increases from first voltage V1 to second voltage V2, delay voltage Vdel increases with a gentle first slope in proportion to external power supply voltage VDD. In a third section in which external power supply voltage VDD increases above second voltage V2, delay voltage Vdel increases with a steep slope in proportion to external power supply voltage VDD. At an operating voltage V3 greater than second voltage V2, the slope of straight line 2c becomes more gradual than that of straight line 1c.

In the first section of FIG. 6B, in which external power supply voltage VDD increases from 0 V to first voltage V1, a bitline charge sharing time decreases in inverse proportion to external power supply voltage VDD. In the second section of FIG. 6B, when external power supply voltage VDD increases from first voltage V1 to second voltage V2, the bitline charge sharing time decreases with a second slope in inverse proportion to external power supply voltage VDD. In the third section of FIG. 6B, when external power supply voltage VDD increases above second voltage V2, bitline charge sharing time Td decreases with a relatively steep slope in inverse proportion to external power supply voltage VDD. At an operating voltage V3 greater than second voltage V2, the slope of straight line 2d is more gradual than that of straight line 1d.

Figure 6:
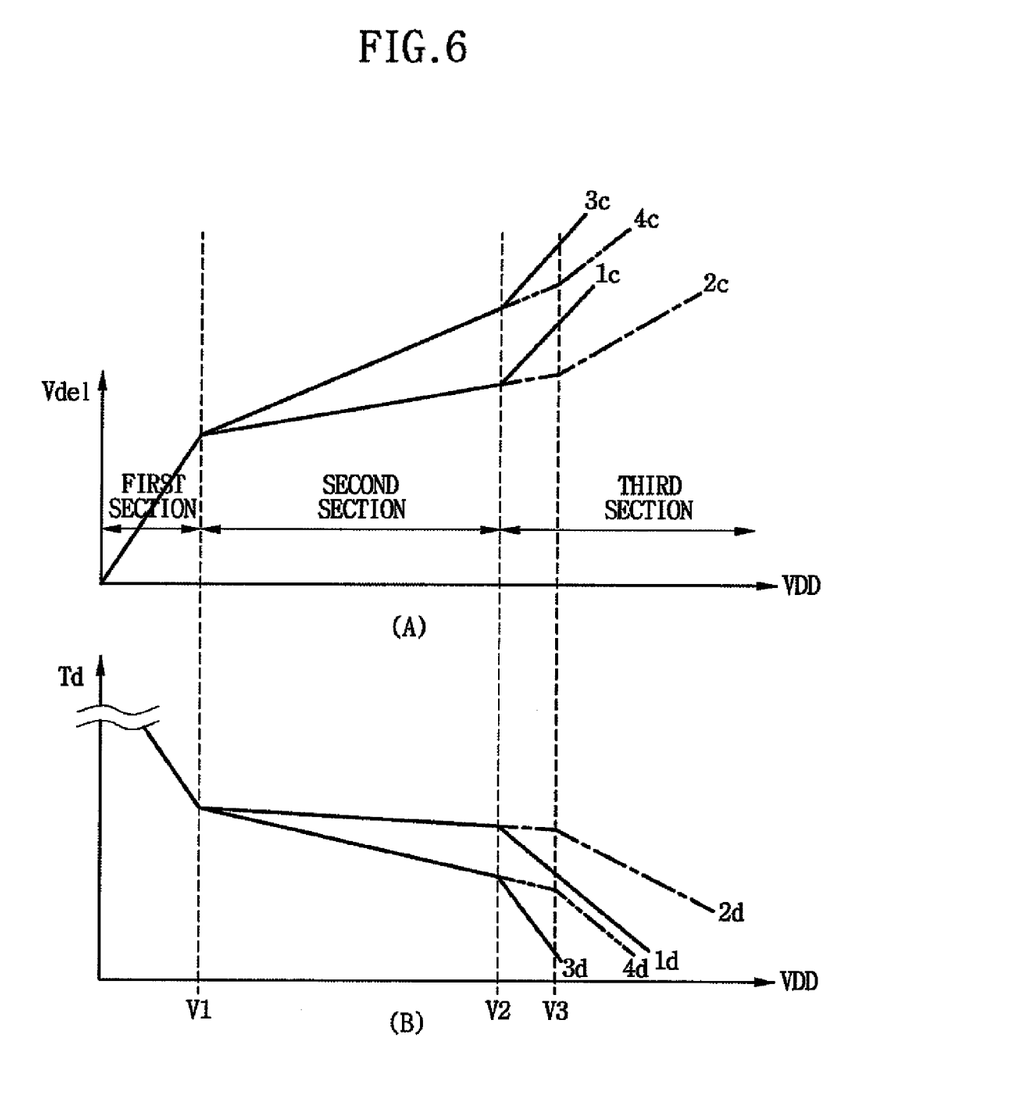
FIGS. 6A and 6B are graphs illustrating the operation of the variable delay circuit illustrated in FIG. 5.

The operation of variable delay circuit 12' in FIG. 5 will be described below with reference to FIGS. 5 and 6.

In FIG. 5, comparison voltage generator 100 receives reference voltage Vref and division voltage Va and outputs a differentially amplified comparison voltage. Voltage driver 200 receives external power supply voltage VDD and outputs output voltage Vb in response to the comparison voltage. Voltage divider 300 receives output voltage Vb and outputs increased division voltage Va, which is expressed by the following equation (7)

$$Va=Vb \times R2/(R1+R2) \tag{9}$$

Thereafter, division voltage Va increases to reference voltage Vref, and the voltage of a voltage follower may be expressed by equation (5): $Vb=Vref \times (1+R1/R2)$.

Meanwhile, first delay voltage adjuster 500 adjusts the slope of delay voltage Vdel according to external power supply voltage VDD by changing the resistance between a node to which external power supply voltage VDD is applied and the common output node of first delay voltage adjusters 500 and 600 under the control of first control signal MRS1. Second delay voltage adjuster 600 adjusts the slope of delay voltage Vdel according to the level of output voltage Vb by changing the resistance between a node to which output voltage Vb is applied and the common output node. Assuming that the total resistance of resistors R41, R42, and R43 connected in parallel in first delay voltage adjuster 500 is R4 and the total resistance of resistors R31, R32, and R33 connected in parallel in second delay voltage adjuster 600 is R3, delay voltage Vdel is expressed according to the voltage divider rule by the following equation (7):

$$Vdel=Vb+(VDD-Vb) \times R3/(R3+R4) \tag{7}$$

In the second section of FIG. 6A, when the semiconductor memory device operates at a normal operating speed, output voltage Vb satisfies equation (7). In the third section of FIG. 6A, when the operating voltage is artificially increased for high-speed operation of the semiconductor memory device, delay voltage Vdel, which is proportional to external power supply voltage VDD, changes according to the voltage divider rule, as expressed by the following equation (8):

$$Vdel=VDD \times (R1+R2+R3)/(R1+R2+R3+R4) \tag{8}$$

In the first section of FIG. 6A, when division voltage Va is lower than reference voltage Vref, PMOS transistor P is turned on, and delay voltage Vdel increases in proportion to an increase in external power supply voltage VDD.

In the second section of FIG. 6A, when division voltage Va increases to the same level as reference voltage Vref, output voltage Vb is fixed and has the constant value $(Vref \times (1+R1/R2))$ of equation (5), independent of an increase in external power supply voltage VDD. Thus, delay voltage Vdel satisfies equation (8) under the influence of second delay voltage adjuster 600.

To be specific, when resistors R31, R32, and R33 are connected in parallel, the total resistance R3 is reduced, and delay voltage Vdel increases with a relatively gradual first slope in proportion to external power supply voltage VDD, as seen from straight lines 1c or 2c. In addition, when only one of switches SW31, SW32, or SW33 is turned on to connect to only one of resistors R31, R32, and R33, the total resistance R3 is increased, and delay voltage Vdel increases with a second slope steeper than the first slope of straight lines 1c or 2c in proportion to external power supply voltage VDD, as seen from straight lines 3c or 4c.

In the third section of FIG. 6A, when division voltage Va further increases to have a higher level than reference voltage Vref, PMOS transistor P of voltage driver 200 is turned off, and delay voltage Vdel satisfies equation (8), beginning with external power supply voltage VDD of second voltage V2 or above. Thus, delay voltage Vdel increases with a constant slope $((R1+R2+R3)/(R1+R2+R3+R4))$ in proportion to an increase in external power supply voltage VDD. The third section of FIG. 6A will be described in further detail below.

Straight line 2c corresponds to a case that only one of switches SW41, SW42, and SW43 of first delay voltage adjuster 500 is turned on in response to first control signal MRS1 to connect only one of resistors R41, R42, and R43. Straight line 1c corresponds to a case that all switches SW41, SW42, and SW43 are turned on in response to first control signal MRS1 to connect all resistors R41, R42, and R43 in parallel. Since resistance R4 of line 1c is larger than resistance R4 of line 2c the slope of line 2c, as defined by equation (8), $((R1+R2+R3)/(R1+R2+R3+R4))$, is more gradual than that of straight line 1c.

Second voltage V2 increases with an increase in resistance R4. As a result, the slope of straight line 2c varies when external power supply voltage VDD increases to third voltage V3.

For this reason, in the first section of FIG. 6A and FIG. 6B, when external power supply voltage VDD increases from 0 V to first voltage V1, delay voltage Vdel increases in proportion to external power supply voltage VDD, and the bitline charge sharing time decreases in inverse proportion to external power supply voltage VDD.

In the second section of FIG. 6A and FIG. 6B, when external power supply voltage VDD increases from first voltage V1 to second voltage V2, delay voltage Vdel increases with the first slope in proportion to external power supply voltage VDD, as seen from straight lines 1c and 2c in FIG. 6A when resistors R31, R32, and R33 are connected in parallel. Thus, the bitline charge sharing time decreases with a relatively gradual third slope in inverse proportion to external power supply voltage VDD. when only one of switches SW31, SW32, or SW33 is turned on to connect only one of resistors R31, R32, and R33, delay voltage Vdel increases with the second slope steeper than the first slope in proportion to external power supply voltage VDD, as seen from straight lines 3c and 4c. Thus, the bitline charge sharing time decreases with a fourth slope steeper than the third slope in inverse proportion to external power supply voltage VDD.

In the third section of FIG. 6A and FIG. 6B, when external power supply voltage VDD increases above second voltage V2, delay voltage Vdel steeply increases with the uniform slope ((R1+R2+R3)/(R1+R2+R3+R4)) in proportion to external power supply voltage VDD when resistors R31, R32, and R33 are connected in parallel, as seen from straight lines 1c or 2c. Thus, as seen from straight lines 1d and 2d in FIG. 6B, the bitline charge sharing time steeply decreases with different slopes in inverse proportion to an increase in external power supply voltage VDD. Meanwhile, when only one of switches SW31, SW32, or SW33 is turned on to connect only one of resistors R31, R32, and R33, the bitline charge sharing time steeply decreases with different slopes in inverse proportion to an increase in external power supply voltage VDD, as seen from straight lines 3d and 4d.

In the third section of FIG. 6B, straight lines 2d and 4d correspond to a case that only one of switches SW41, SW42, and SW43 of first delay voltage adjuster 500 is turned on in response to first control signal MRS1 to connect to only one of resistors R41, R42, and R43. Further, straight lines 1d and 3d correspond to a case that all switches SW41, SW42, and SW43 are turned on in response to first control signal MRS1 to connect resistors R41, R42, and R43 in parallel. Here, the slope of straight lines 2d and 4d is gentler than that of straight lines 1d and 3d. In other words, the bitline charge sharing time corresponding to a case that only one of switches SW41, SW42, or SW43 of first delay voltage adjuster 500 is selectively turned on decreases slower than the bitline charge sharing time corresponding to a case that all switches SW41, SW42, and SW43 are turned on.

Meanwhile, second voltage V2 has an increase in resistance R4, and thus the slope of straight line 2d varies when external power supply voltage VDD increases to third voltage V3.

As described above, first delay voltage adjuster 500 comprises resistors R41, R42, and R43 connected in parallel and switches SW41, SW42, and SW43 connected in parallel, and first delay voltage adjuster 500 adjusts the slope of the level of delay voltage Vdel according to external power supply voltage VDD by controlling switches SW41, SW42, and SW43 in response to first control signal MRS1. Second delay voltage adjuster 600 comprises resistors R31, R32, and R33 and switches SW31, SW32, and SW33 connected in parallel, and second delay voltage adjuster 600 adjusts the slope of delay voltage Vdel according to external power supply voltage VDD by controlling switches SW31, SW32, and SW33 in response to second control signal MRS2. Alternatively, first delay voltage adjuster 500 may comprise resistors R41, R42, and R43 and a plurality of transmission gates connected in parallel and adjust the slope of the level of delay voltage Vdel by controlling the transmission gates to open or close in response to first control signal MRS1. Second delay voltage adjuster 600 may comprise resistors R31, R32, and R33 and a plurality of transmission gates connected in parallel and adjust the slope of the level of delay voltage Vdel by controlling the transmission gates to open or close in response to second control signal MRS2.

In brief, variable delay circuit 12' in the semiconductor memory device according to the second example embodiment increases delay voltage Vdel with a gentle slope until external power supply voltage VDD increases to a predetermined level, and variable delay circuit 12' increases the level of delay voltage Vdel with a steep slope at external power supply voltage VDD of a predetermined operating voltage or above, thereby adjusting the bitline charge sharing time. Consequently, it is possible to improve the operating speed of the semiconductor memory device by artificially increasing the operating voltage for high-speed operation.

As described above, a semiconductor memory device according to example embodiments can increase its operating speed according to an operating voltage, and it can improve the reliability of operation when the operating voltage is artificially increased for high-speed operation.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
a memory cell configured to output data to a pair of bitlines;
a variable delay circuit which includes a delay adjuster configured to receive a sense amplifier enable signal and output a delayed sense amplifier enable signal which is delayed according to a voltage slope of a delay voltage; and
a bitline sense amplifier configured to amplify a voltage difference between the pair of bitlines in response to the delayed sense amplifier enable signal and output the amplified voltage difference to a pair of input/output lines,
wherein the variable delay circuit is configured to adjust the voltage slope of the delay voltage according to an external power supply as the external power supply increases from a first voltage to a predetermined supply voltage.

2. A semiconductor memory device, comprising:
a memory cell configured to output data to a pair of bitlines;
a variable delay circuit configured to receive a sense amplifier enable signal, adjust a delay of the sense amplifier enable signal by adjusting a slope of a delay voltage based on a variable external power supply voltage, and output a delayed sense amplifier enable signal; and
a bitline sense amplifier configured to amplify a voltage difference between the pair of bitlines in response to the delayed sense amplifier enable signal and output the amplified voltage difference to a pair of input/output lines,
wherein the variable delay circuit comprises:
an internal voltage generator configured to receive a reference voltage and the external power supply voltage and cause the delay voltage to reach to a predetermined level;
a first delay voltage adjuster that is operable to adjust the slope of the delay voltage according to an increase in the external power supply voltage in response to a first control signal; and
a delay adjuster configured to receive the sense amplifier enable signal, adjust the delay of the sense amplifier enable signal according to a change in the delay voltage, and output the delayed sense amplifier enable signal.

3. The semiconductor memory device of claim 2, wherein the first delay voltage adjuster comprises:
a plurality of first resistors connected in parallel, each of the first resistors having a first end and a second end, the respective first ends configured to receive the external power supply voltage; and
a plurality of first switches each having a first end connected to an output node receiving the delay voltage, and a second end configured to be connected with a corresponding one of the second ends of the first resistors in response to the first control signal.

4. The semiconductor memory device of claim 2, wherein the first delay voltage adjuster keeps the delay voltage at a predetermined voltage level in a first section in which the semiconductor memory device operates at a normal speed, and increases the delay voltage with a first slope in proportion to the increase in the external power supply voltage in a second section in which the external power supply voltage is increased for high-speed operation.

5. The semiconductor memory device of claim 4, wherein the first delay voltage adjuster increases the first slope in proportion to a number of first switches turned on in response to the first control signal in the second section.

6. The semiconductor memory device of claim 4, wherein the delay adjuster maintains a uniform bitline charge sharing time as the delay voltage is maintained at the predetermined level in the first section, and reduces the bitline charge sharing time with a second slope in inverse proportion to the increase in the external power supply voltage as the voltage of the output node increases with the first slope in the second section.

7. The semiconductor memory device of claim 4, wherein the variable delay circuit further comprises:
a second delay voltage adjuster configured to increase the delay voltage with a third slope more gradual than the first slope in proportion to the increase in the external power supply voltage in response to a second control signal in the first section.

8. The semiconductor memory device of claim 7, wherein the second delay voltage adjuster comprises:
a plurality of second resistors connected in parallel, each of the second resistors comprising a first end and a second end, the respective second ends receiving the output voltage; and
a plurality of second switches each having one end connected to a corresponding one of the second resistors, and another end connected with a second end of a corresponding one of the second resistors in response to the second control signal.

9. The semiconductor memory device of claim 8, wherein the second delay voltage adjuster increases the third slope in proportion to a number of second switches turned on in response to the second control signal in the first section.

10. The semiconductor memory device of claim 7, wherein the delay adjuster reduces a bitline charge sharing time with a fourth slope in inverse proportion to the increase in the external power supply voltage as the output voltage increases with the third slope in the first section, and
reduces the bitline charge sharing time with a sixth slope steeper than the fourth slope in inverse proportion to the increase in the external power supply voltage as the output voltage increases with a fifth slope steeper than the third slope in the second section.

11. The semiconductor memory device of claim 1, wherein the memory cell is a dynamic random access memory (DRAM) cell.

12. The semiconductor memory device of claim 1, wherein the first voltage is 0 volts.

13. A semiconductor memory device, comprising:
a variable delay circuit configured to receive a sense amplifier enable signal, adjust a delay of the sense amplifier enable signal by adjusting a slope of a delay voltage based on a variable external power supply voltage, and output a delayed sense amplifier enable signal,
wherein the variable delay circuit comprises:
an internal voltage generator configured to receive a reference voltage and a external power supply voltage and cause a delay voltage to reach to a predetermined level;
a delay voltage adjuster that is operable to adjust the slope of the delay voltage according to an increase in the external power supply voltage in response to a control signal; and
a delay adjuster configured to receive a sense amplifier enable signal, adjust a delay of the sense amplifier enable signal according to a change in the delay voltage, and output the delayed sense amplifier enable signal.

14. The semiconductor memory device of claim 13, wherein the variable delay circuit further comprises:
a memory cell configured to output data to a pair of bitlines; and
a bitline sense amplifier configured to amplify a voltage difference between the pair of bitlines in response to the delayed sense amplifier enable signal and output the amplified voltage difference to a pair of input/output lines.

* * * * *